(12) United States Patent
Lee et al.

(10) Patent No.: US 11,038,110 B2
(45) Date of Patent: Jun. 15, 2021

(54) METHOD FOR MANUFACTURING ELECTRONIC DEVICE AND METHOD FOR REMOVING IMPURITY USING SAME

(71) Applicant: Ewha University—Industry Collaboration Foundation, Seoul (KR)

(72) Inventors: Sang Wook Lee, Seoul (KR); Dong Hoon Shin, Uiwang-si (KR)

(73) Assignee: Ewha University—Industry Collaboration Foundation, Seoul (KR)

( * ) Notice: Subject to any disclaimer, the term of this patent is extended or adjusted under 35 U.S.C. 154(b) by 237 days.

(21) Appl. No.: 16/304,061

(22) PCT Filed: Mar. 9, 2018

(86) PCT No.: PCT/KR2018/002798
§ 371 (c)(1),
(2) Date: Nov. 21, 2018

(87) PCT Pub. No.: WO2018/164522
PCT Pub. Date: Sep. 13, 2018

(65) Prior Publication Data
US 2020/0321528 A1    Oct. 8, 2020

(30) Foreign Application Priority Data

Mar. 9, 2017 (KR) .................. 10-2017-0030271

(51) Int. Cl.
*H01L 51/00* (2006.01)
*C01B 32/194* (2017.01)
*H01L 21/322* (2006.01)

(52) U.S. Cl.
CPC ........ *H01L 51/0013* (2013.01); *C01B 32/194* (2017.08); *H01L 21/3221* (2013.01); *H01L 51/0025* (2013.01)

(58) Field of Classification Search
None
See application file for complete search history.

(56) References Cited

U.S. PATENT DOCUMENTS 9,919,472 B1 * 3/2018 Cohen .................... B23K 26/40

FOREIGN PATENT DOCUMENTS

JP    2004-200572 A    7/2004
JP    2004-319460 A    11/2004
(Continued)

OTHER PUBLICATIONS

International Search Report for PCT/KR2018/002798 dated Jun. 29, 2018, all pages.
(Continued)

*Primary Examiner* — Michelle Mandala
(74) *Attorney, Agent, or Firm* — Kilpatrick Townsend & Stockton LLP

(57) ABSTRACT

Provided are a method for manufacturing an electronic device capable of efficiently utilizing a material and a method for removing impurities using the same. The method for manufacturing an electronic device comprises the steps of: placing a transfer film on a plurality of functional layers which are positioned apart from each other on a source substrate; bringing a first transfer target into close contact with the lower surface of the transfer film by applying pressure to a portion of the transfer film that corresponds to the first transfer target from among the plurality of functional layers by using a probe; separating the transfer film from the source substrate in a state in which the first transfer target is in close contact with the lower surface; placing the transfer film on a target substrate in the state in which the first transfer target is in close contact with the lower surface; placing the first transfer target on the target substrate by applying pressure to a portion of the transfer film that (Continued)

corresponds to the first transfer target; and separating the transfer film from the target substrate in a state in which the first transfer target is positioned on the target surface.

19 Claims, 14 Drawing Sheets

(56) References Cited

FOREIGN PATENT DOCUMENTS

| KR | 10-1303930 B1 | 9/2013 |
| KR | 10-2017-0011770 A | 2/2017 |
| WO | 2014-123319 A1 | 8/2014 |
| WO | 2018-164522 A1 | 9/2018 |

OTHER PUBLICATIONS

Written Opinion for PCT/KR2018/002798 dated Jun. 29, 2018, all pages. (No English translation provided).
Korean Office Action for 10-2017-0030271 dated Jun. 20, 2018, all pages. (No English translation provided).

* cited by examiner

METHOD FOR MANUFACTURING ELECTRONIC DEVICE AND METHOD FOR REMOVING IMPURITY USING SAME

TECHNICAL FIELD

The present disclosure relates to a method for manufacturing an electronic device, and a method for removing impurities using the same, and more particularly, to a method for manufacturing an electronic device capable of efficiently utilizing a material and a method for removing impurities using the same.

BACKGROUND ART

Generally, in manufacturing an electronic device, a specific film is formed. The film is formed directly on a substrate that is to be a component of the electronic device, or the film is formed on another support body and then transferred to the substrate as necessary.

However, typical methods for manufacturing electronic devices have many constraints including a constraint requiring that the same components are simultaneously formed on a plurality of electronic devices in a process of transferring a film.

DESCRIPTION OF EMBODIMENTS

Technical Problem

The present disclosure is to solve various problems including the above-described problem and aims to provide a method for manufacturing an electronic device capable of efficiently utilizing a material and a method for removing impurities using the same. However, the object of the present disclosure is an example, and the scope of the present disclosure is limited thereto.

Solution to Problem

According to an aspect of the present disclosure, there is provided a method for manufacturing an electronic device, including: placing a transfer film on a plurality of functional layers positioned apart from each other on a source substrate; applying pressure to a portion of the transfer film that corresponds to a first transfer target from among the plurality of functional layers through a probe to bring the first transfer target into close contact with a lower surface of the transfer film; separating the transfer film from the source substrate in a state in which the first transfer target is in close contact with the lower surface of the transfer film; placing the transfer film on a target substrate in the state in which the first transfer target is in close contact with the lower surface of the transfer film; applying pressure to a portion of the transfer film corresponding to the first transfer target to place the first transfer target on the target substrate; and separating the transfer film from the target substrate in a state in which the first transfer target is placed on the target substrate.

According to another aspect of the present disclosure, there is provided a method for manufacturing an electronic device, including: placing a transfer film on a plurality of functional layers positioned apart from each other on a source substrate; applying pressure to a portion of the transfer film that corresponds to a first transfer object from among the plurality of functional layers through a probe to bring the first transfer target into close contact with a lower surface of the transfer film; applying pressure to a portion of the transfer film that corresponds to a second transfer object from among the plurality of functional layers through the probe to bring the second transfer target into close contact with the lower surface of the transfer film; separating the transfer film from the source substrate in a state in which the first transfer target and the second transfer target are in close contact with the lower surface of the transfer film; aligning the transfer film with respect to a target substrate in the state in which the first transfer target and the second transfer target are in close contact with the lower surface of the transfer film to place the transfer film on the target substrate; applying pressure to a portion of the transfer film corresponding to the first transfer target to place the first transfer target on the target substrate; separating the transfer film from the target substrate in a state in which the first transfer target is placed on the target substrate and the second transfer target is in close contact with the lower surface of the transfer film; aligning the transfer film with respect to the target substrate in the state in which the second transfer target is in close contact with the lower surface of the transfer film to place the transfer film on the target substrate; and applying pressure to a portion of the transfer film that corresponds to the second transfer target to place the second transfer target on the target substrate; and separating the transfer film from the target substrate in a state in which the first transfer target and the second transfer target are placed on the target substrate.

The plurality of functional layers may include: a one-dimensional micro material layer or a one-dimensional nano material layer, including a shape of tubes, wires, or bars; or a two-dimensional micro material layer or a two-dimensional nano material layer, including graphene, transition metal dichalocogenide, hexagonal boron nitride, or phosphorus black.

The transfer film may include polydimethylsiloxane (PDMS), CYTOP, polymethylmethacrylate (PMMA), ethyl lactate, polycarbonate (PC), poly propylene carbonate (PPC), polyimide (PI), para-aramid fibrid, polyethylene terephthalate (PET), polyvinyl chloride (PVC), polyvinyl acetate (PVAc), silica-gel, or polyurethane acrylate (PUA).

A first temperature of a surrounding environment during operation of bringing the first transfer target into close contact with the lower surface of the transfer film may be different from a second temperature of a surrounding environment during operation of placing the first transfer target on the target substrate. The first temperature may be higher than the second temperature. More specifically, the first temperature may be between 50° C. and 130° C., and the second temperature may be between 10° C. and 30° C.

Furthermore, the method may further include: again placing the transfer film on the remaining functional layers on the source substrate; applying pressure to a portion of the transfer film that corresponds to a second transfer target from among the remaining functional layers through the probe to bring the second transfer target into close contact with the lower surface of the transfer film; separating the transfer film from the source substrate in a state in which the second transfer target is in close contact with the lower surface of the transfer film; placing the transfer film on the target substrate in the state in which the second transfer target is in close contact with the lower surface of the transfer film; applying pressure on a portion of the transfer film that corresponds to the second transfer target to place the second transfer target on the target substrate; and separating the transfer film from the target substrate in a state in which the second transfer target is placed on the target substrate.

According to another aspect of the present disclosure, there is provided a method for removing an impurity, including: forming a functional layer on a substrate; placing a transfer film on a first impurity on the substrate; applying pressure to a portion of the transfer film that corresponds to the first impurity through a probe to bring the first impurity into close contact with a lower surface of the transfer film; and separating the transfer film from the substrate in a state in which the first impurity is in close contact with the lower surface of the transfer film.

Furthermore, the method may further include: placing the transfer film on a removal substrate in the state in which the first impurity is in close contact with the lower surface of the transfer film; applying pressure to a portion of the transfer film that corresponds to the first impurity to place the first impurity on the removal substrate; and separating the transfer film from the removal substrate in a state in which the first impurity is placed on the removal substrate.

Meanwhile, the method may further include: again placing the transfer film on a second impurity on the substrate; applying pressure to a portion of the transfer film that corresponds to the second impurity through a probe to bring the second impurity into close contact with the lower surface of the transfer film; and separating the transfer film from the substrate in a state in which the second impurity is in close contact with the lower surface of the transfer film.

The transfer film may include polydimethylsiloxane (PDMS), CYTOP, polymethylmethacrylate (PMMA), ethyl lactate, polycarbonate (PC), poly propylene carbonate (PPC), polyimide (PI), para-aramid fibrid, polyethylene terephthalate (PET), polyvinyl chloride (PVC), polyvinyl acetate (PVAc), silica-gel, or polyurethane acrylate (PUA).

A first temperature of a surrounding environment during operation of bringing the first impurity into close contact with the lower surface of the transfer film may be different from a second temperature of a surrounding environment during operation of placing the first impurity target on the removal substrate. That is, the first temperature may be higher than the second temperature. More specifically, the first temperature may be between 50° C. and 130° C., and the second temperature may be between 10° C. and 30° C.

Other aspects, features, and advantages than those described above will be obvious from the following drawings and claims, and the detailed description.

Advantageous Effects of Disclosure

According to an embodiment of the present disclosure as described above, a method for manufacturing an electronic device capable of efficiently utilizing a material and a method for removing impurities using the same may be implemented. However, the scope of the present disclosure is not limited to the effects.

BEST MODE

Figure 1:
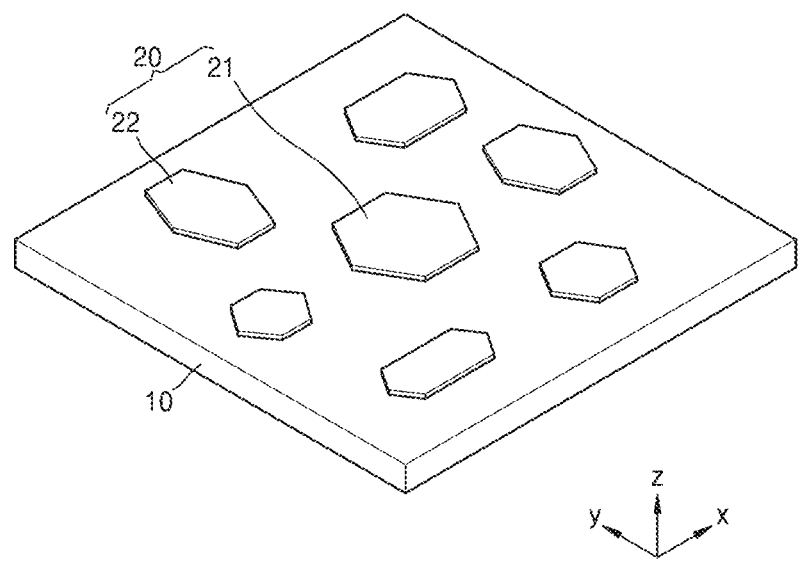
FIGS. 1 to 7 are perspective views schematically showing processes for an electronic device manufacturing method according to an embodiment of the present disclosure.

It will be understood by those skilled in the art that various changes in form and details various embodiments may be made therein without departing from the spirit and scope of the present disclosure. Specific embodiments will be shown in the drawings, and described in the detailed description. Effects and features of the present disclosure, and a method for achieving the effects and features will be apparent by referring to the following detailed description and embodiments described below in connection with the accompanying drawings. However, the present disclosure is not limited to these embodiments, and may be embodied in another form.

Hereinafter, the embodiments of the present disclosure will be described in detail with reference to the accompanying drawings, and in the following description provided with reference to the drawings, the same or corresponding components will be assigned the same reference numerals, and overlapping descriptions therefor will be omitted.

In the following embodiments, it will also be understood that when a component, such as a layer, a film, an area, a plate, etc., is referred to as being "on" or "over" another component, it can be directly on the other component or intervening components may also be present. Also, for easy understanding, the sizes of components shown in the drawings are more or less exaggeratedly shown. For example, the sizes and thicknesses of the components shown in the drawings are arbitrarily represented for convenience of description, and the present disclosure is not necessarily limited to those shown in the drawings.

In the following description, x-, y-, and z-axes are not limited to three axes on the orthogonal coordinates system, and are interpreted in a broad sense including three axes on the orthogonal coordinates system. For example, the x-, y-, and z-axes may be orthogonal to one another, and also indicate different directions that are not orthogonal to one another.

FIGS. 1 to 7 are perspective views schematically showing processes for an electronic device manufacturing method according to an embodiment of the present disclosure.

First, a first film 20 may be prepared. The first film 20 may be prepared on a source substrate 10 such as a wafer or silicon oxide. The first film 20 may be prepared without being patterned, and then treated in a predetermined form as necessary.

For example, the first film 20 may be graphene. In this case, a graphene film not patterned may be formed or placed on the source substrate 10, and then patterned to a desired form and/or size through electron beam lithography and/or a 02 plasma process, etc. to thereby form a plurality of functional layers 21 and 22 as shown in FIG. 1. The plurality of functional layers 21 and 22 may be bonded to the source substrate 10 with a weak bonding strength so as to be easily separated from the source substrate 10 later. Accordingly, after the first film 20 is formed or after the plurality of functional layers 21 and 22 are formed, a process of mechanically peeling the first film 20 or the functional layers 21 and 22 from the source substrate 10 may be performed as necessary.

However, the plurality of functional layers 21 and 22 are not limited to graphene and may include an organic semiconductor material, carbon nanotubes, or transition metal dichalcogenide. For example, the plurality of functional layers 21 and 22 may include a one-dimensional micro material layer having the shape of tubes, wires, or bars, or a one-dimensional nano material layer having the shape of tubes, wires, or bars. Also, the plurality of functional layers 21 and 22 may include a two-dimensional micro material layer including graphene, transition metal dichalocogenide, hexagonal boron nitride, or phosphorus black, or a two-dimensional nano material layer including graphene, transition metal dichalocogenide, hexagonal boron nitride, or phosphorus black. The examples of the materials will also be applied to the following embodiments and their modifications.

Figure 2:
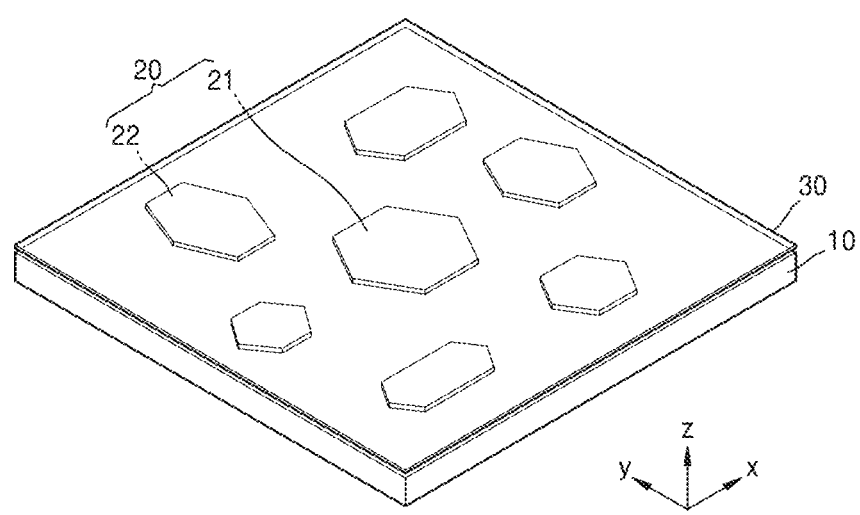

Thereafter, as shown in FIG. 2, a transfer film 30 may be placed on the source substrate 10. More specifically, the transfer film 30 may be placed on the plurality of functional layers 21 and 22 positioned apart from each other. The transfer film 30 may include polydimethylsiloxane (PDMS), CYTOP, polymethylmethacrylate (PMMA), ethyl lactate, polycarbonate (PC), poly propylene carbonate (PPC), polyimide (PI), para-aramid fibrid, polyethylene terephthalate (PET), polyvinyl chloride (PVC), polyvinyl acetate (PVAc), silica-gel, or polyurethane acrylate (PUA).

The transfer film 30 may be formed by forming the transfer film 30 on a separate support body through spin coating or the like, and separating the transfer film 30 from the support body. The transfer film 30 may be bonded to at least one of the plurality of functional layers 21 and 22 to transfer the at least one of the plurality of functional layers 21 and 22.

As shown in FIG. 2, when the transfer film 30 is placed on the plurality of functional layers 21 and 22 positioned apart from each other, the source substrate 10 and the plurality of functional layers 21 and 22 may be not in close contact with (not bonded to) the transfer film 30, although they contact the transfer film 30. Accordingly, when the transfer film 30 is separated from the source substrate 10, the plurality of functional layers 21 and 22 may remain on the source substrate 10. Therefore, it may be necessary to bring a functional layer corresponding to a transfer target among the plurality of functional layers 21 and 22 into close contact with the transfer film 30.

Figure 3:
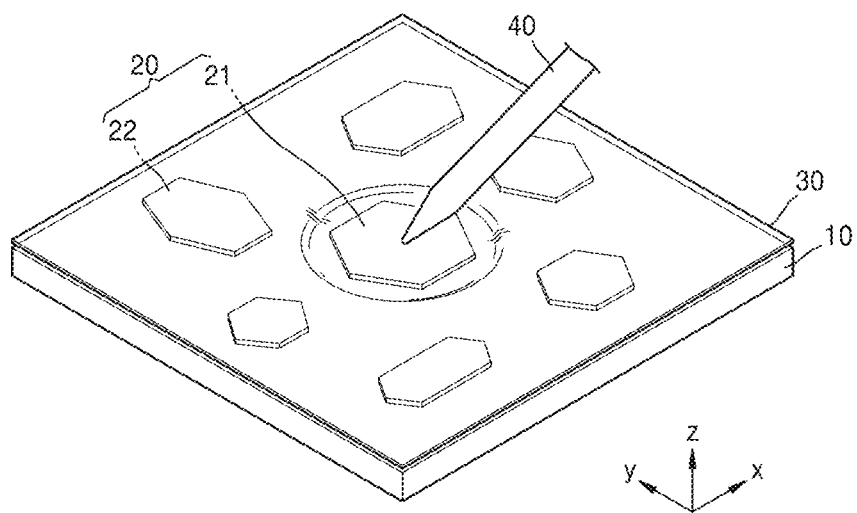
Figure 4:
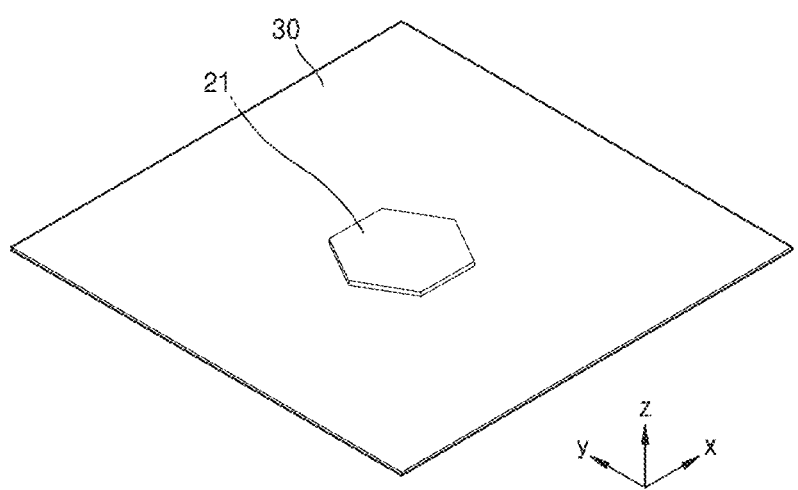

For this, as shown in FIG. 3, pressure may be applied to a portion of the transfer film 30 that corresponds to a first transfer target 21 from among the plurality of functional layers 21 and 22 by using a probe 40. When pressure is applied to the transfer film 30, van der Waals' forces may increase between the transfer film 30 and the first transfer target 21 below the transfer film 30 so that the first transfer target 21 comes into close contact with the lower surface of the transfer film 30. Then, when the transfer film 30 is separated from the source substrate 10, the transfer film 30 may be separated from the source substrate 10 in the state in which the first transfer target 21 is in close contact with the lower surface (in a negative (−) z-axis direction) of the transfer film 30, as shown in FIG. 4.

When the thickness of the transfer film 30 is very small although the transfer film 30 includes polydimethylsiloxane or another material, the transfer film 30 may be transparent or semi-transparent. Accordingly, although the transfer film 30 is placed on the plurality of functional layers 21 and 22 positioned apart from each other, as shown in FIG. 2, the positions of the plurality of functional layers 21 and 22 below the transfer film 30 may be shown through the transfer film 30. Accordingly, as shown in FIG. 3, pressure may be applied to an exact portion of the transfer film 30 that corresponds to the first transfer object 21 from among the plurality of functional layers 21 and 22 through the probe 40.

Figure 5:
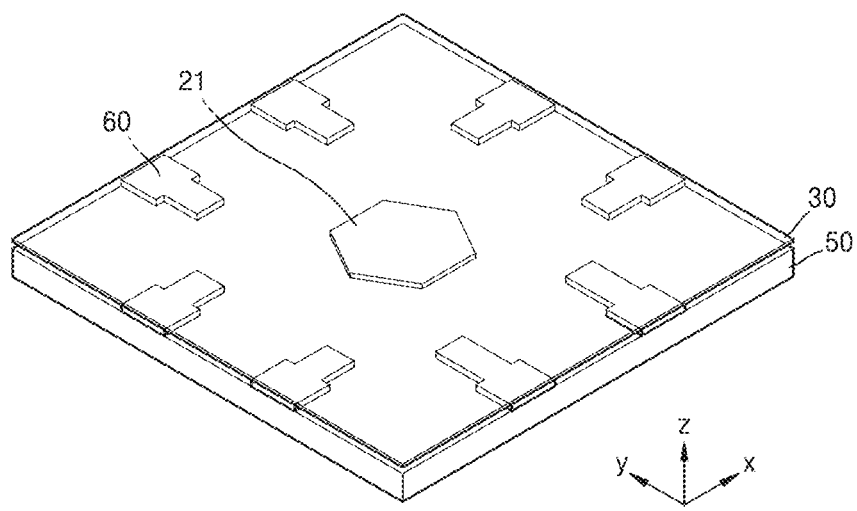

Thereafter, the transfer film 30, whose lower surface the first transfer target 21 is in close contact with, may be separated from the source substrate 10, and then, the transfer film 30, whose lower surface the first transfer target 21 is in close contact with, may be placed on a target substrate 50 such as a wafer or silicon oxide, as shown in FIG. 5. On the target substrate 50, electrode patterns 60, etc. may have been formed in advance as necessary, as shown in FIG. 5. At this time, a relative position of the first transfer target 21 and the transfer film 30 with respect to the target substrate 50 may be adjusted such that the first transfer target 21 corresponds to a predetermined portion on the target substrate 50.

Figure 6:
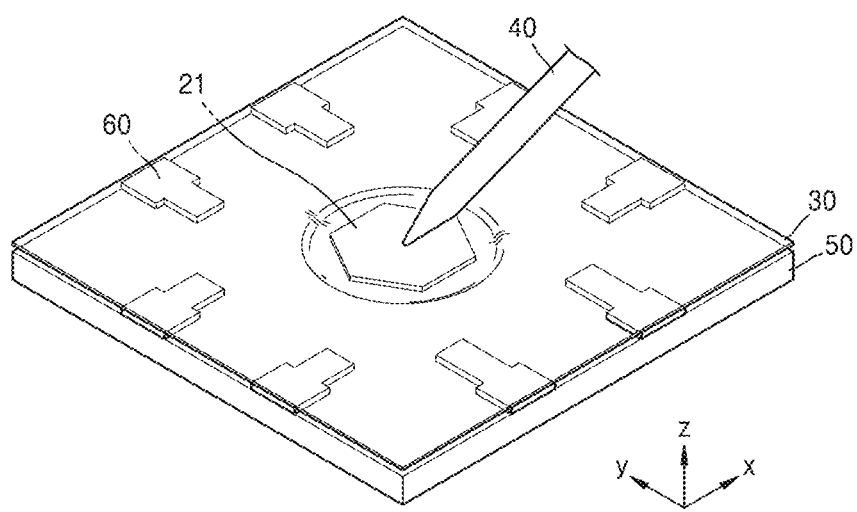
Figure 7:
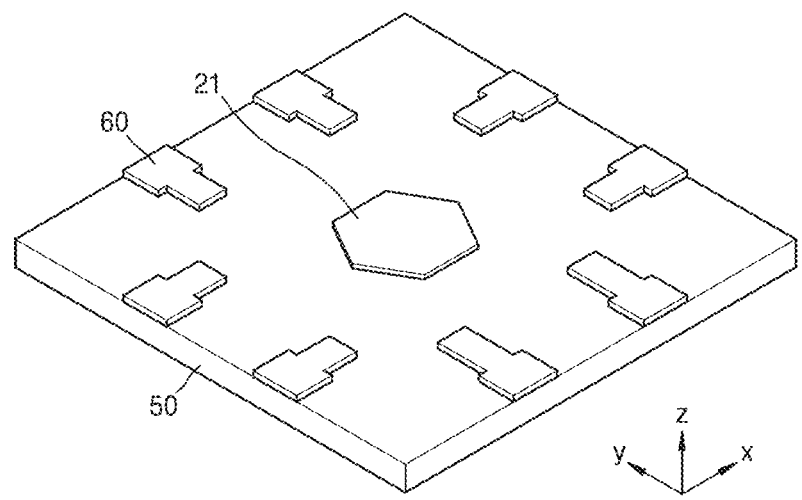

Thereafter, as shown in FIG. 6, pressure may be applied to the portion of the transfer film 30 corresponding to the first transfer target 21 to place the first transfer target 21 at the predetermined portion on the target substrate 50. At this time, likewise, pressure may be applied selectively to the portion of the transfer film 30 through the probe 40. As such, by applying pressure to the transfer film 30, van der Waals's forces may increase between the target substrate 50 and the first transfer target 21 below the transfer film 30 so that the first transfer target 21 comes into close contact with the target substrate 50. Accordingly, when the transfer film 30 is separated from the target substrate 50, the target film 30 may be separated from the target substrate 50 in the state in which the first transfer target 21 is in close contact with the target substrate 50, as shown in FIG. 7. Accordingly, as shown in FIG. 7, an electronic device in which the first transfer target 21 is positioned at a predetermined location may be manufactured. FIG. 7 shows a case in which the first transfer target 21 is positioned apart from the electrode patterns 60 formed on the target substrate 50, for simplification of the drawings. However, the first transfer target 21 may be electrically connected to any one of the electrode patterns 60.

As described above, when the thickness of the transfer film 30 is very small although the transfer film 30 includes polydimethylsiloxane or another material, the transfer film 30 may be transparent or semi-transparent. Accordingly, as shown in FIG. 5, when a user aligns the transfer film 30, whose lower surface the first transfer target 21 is in close contact with, on the target substrate 50 on which the electrode patterns 60, etc. are formed, the user may align the transfer film 30 on the target substrate 50, while confirming the position of the first transfer target 21 with respect to the electrode patterns 60, etc. on the target substrate 50 through the transfer film 30. Also, the user may check the position of the first transfer target 21 being in close contact with the lower surface of the transfer film 30 through the transfer film 30 even after the alignment is performed. Accordingly, as shown in FIG. 6, pressure may be applied to an exact portion of the transfer film 30 that corresponds to the first transfer target 21 through the probe 40.

In a typical method for manufacturing an electronic device, when a specific film is transferred to a target substrate, only the specific film has to exist on a source substrate, and if another film exists on the source substrate in addition to the specific film, the other film will be also transferred to the target substrate together with the specific film. The "other film" is made of the same material as the "specific film" which is a transfer target, and exists together with the "specific film" on the source substrate in such a way to be positioned apart from the "specific film". For example, the "specific film" may be at least any one of the remaining layers except for the first transfer target 21 among the plurality of functional layers 21 and 22 existing on the source substrate 10, as shown in FIG. 1. Also, the "other film" may be an impurity existing on the source substrate together with the "specific film" which is a transfer target.

In the electronic device manufacturing method according to the current embodiment, only the first transfer target 21 among various components positioned apart from each other on the source substrate 10 may be exactly and selectively transferred to the target substrate 50. Accordingly, it may be possible to significantly increase the productivity of electronic devices. For example, as shown in FIG. 1, by simultaneously forming the plurality of functional layers 21 and 22 positioned apart from each other on the source substrate 10, and selectively and/or sequentially transferring desired ones among the plurality of functional layers 21 and 22 onto the at least one target substrate 50, a plurality of electronic devices may be efficiently manufactured, while reducing a total amount of a material to be used. Also, even when an impurity, etc. exists on the source substrate 10 together with a transfer target, only the transfer target except for the impurity may be selectively picked up and transferred to the target substrate 50, thereby significantly lowering the generation rate of errors in a manufacturing process.

Meanwhile, a surrounding environment condition when the first transfer target 21 comes into close contact with the lower surface of the transfer film 30 may be different from a surrounding environment condition when the first transfer target 21 being in close contact with the lower surface of the transfer film 30 is placed on the target substrate 50. The reason for this is to facilitate, when pressure is applied to the transfer film 30 through the probe 40 and/or in the similar situation, bringing the first transfer target 21 into close contact with the transfer film 30 in a certain case and for bringing the first transfer target 21 into close contact with the target substrate 50 in another case.

For example, when the temperature of a surrounding environment during the operation of bringing the first transfer target 21 into close contact with the lower surface of the transfer film 30 is a first temperature, and the temperature of a surrounding environment during operation of bringing the first transfer target 21 being in close contact with the lower surface of the transfer film 30 into close contact with the target substrate 50 is a second temperature, the first temperature may be different from the second temperature. More specifically, the first temperature may be between 50° C. and 130° C., and the second temperature may be between 10° C. and 30° C. As such, by setting the first temperature to be higher than the second temperature, the first transfer target 21 on the source substrate 10 may be brought into close contact with the lower surface of the transfer film 30 upon pressing at the first temperature and the first transfer target 21 being in close contact with the lower surface of the transfer film 30 may be brought into close contact with the target substrate 50 upon pressing at the second temperature. The reason for this is because van der Waals' forces, which is adherence between the first transfer target 21 and a contact object, change depending on temperature.

MODE OF DISCLOSURE

FIGS. 8 to 13 are perspective views schematically showing processes for an electronic device manufacturing method according to another embodiment of the present disclosure. FIGS. 8 to 18 show processes that will be performed after the processes described above with reference to FIGS. 1 to 7.

Figure 8:
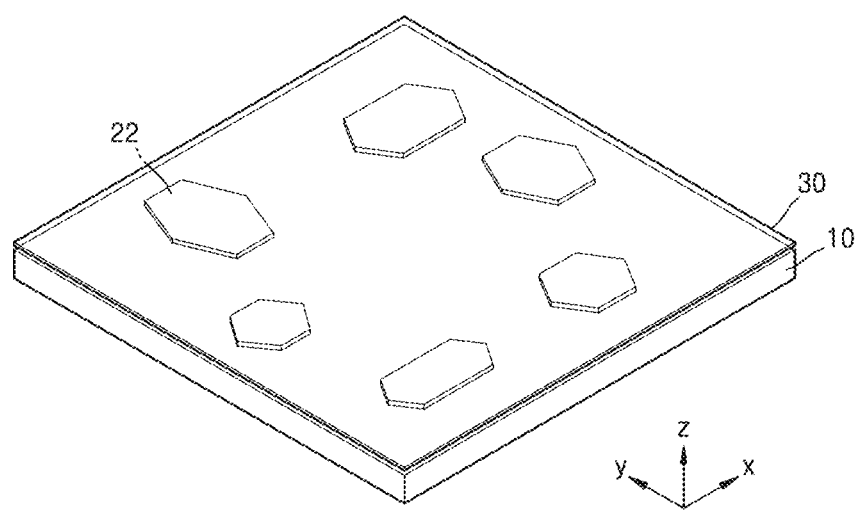
FIGS. 8 to 13 are perspective views schematically showing processes for an electronic device manufacturing method according to another embodiment of the present disclosure.

As described above, since the first transfer target 21 on the source substrate 10 has been transferred to the target substrate 50, the first transfer target 21 may no longer exist on the source substrate 10, as shown in FIG. 8. However, various other functional layers except for the first transfer target 21 may still remain on the source substrate 10, and some of the remaining functional layers may be selectively transferred to another substrate from the source substrate 10, as necessary. For this, the transfer film 30 may be again placed on the remaining functional layers on the source substrate 10, as shown in FIG. 8. The transfer film 30 may be the transfer film 30 used to transfer the first transfer target 21, or a new transfer film 30.

Figure 9:
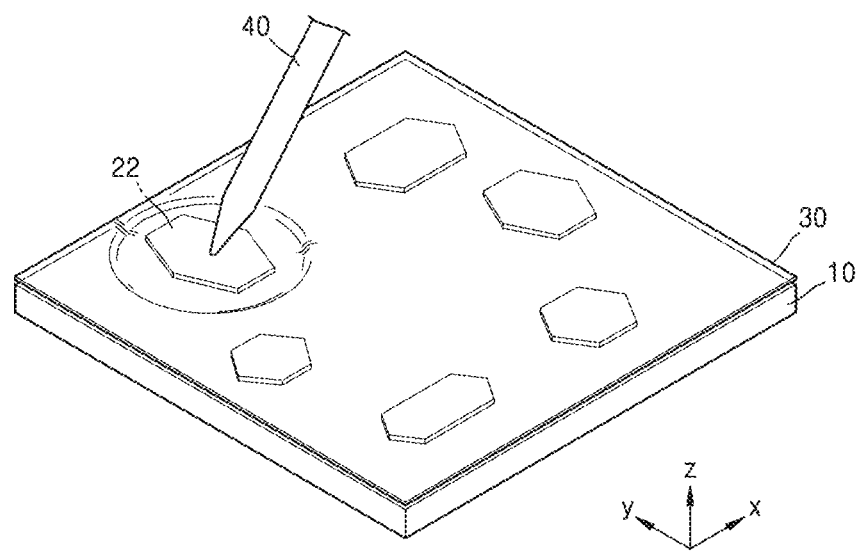

As shown in FIG. 9, when the transfer film 30 is placed on the remaining functional layers positioned apart from each other, the source substrate 10 and the remaining functional layers may be not in close contact with (not bonded to) the transfer film 30, although they contact the transfer film 30. Accordingly, when the transfer film 30 is separated from the source substrate 10, the remaining functional layers may remain on the source substrate 10. Therefore, it may be necessary to bring a functional layer corresponding to a transfer target among the remaining functional layers into close contact with the transfer film 30.

Figure 10:
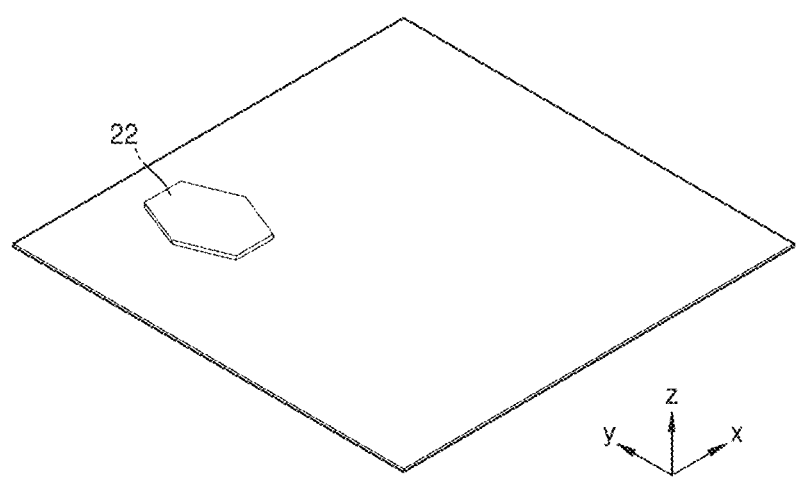

For this, as shown in FIG. 9, pressure may be applied to a portion of the transfer film 30 that corresponds to a second transfer target 21 from among the remaining functional layers by using the probe 40. When pressure is applied to the transfer film 30, van der Waals' forces may increase between the transfer film 30 and the second transfer target 21 below the transfer film 30 so that the second transfer target 22 comes into close contact with the lower surface of the transfer film 30. Then, when the transfer film 30 is separated from the source substrate 10, the transfer film 30 may be separated from the source substrate 10 in the state in which the second transfer target 22 is in close contact with the lower surface (in a negative (−) z-axis direction) of the transfer film 30, as shown in FIG. 10.

Figure 11:
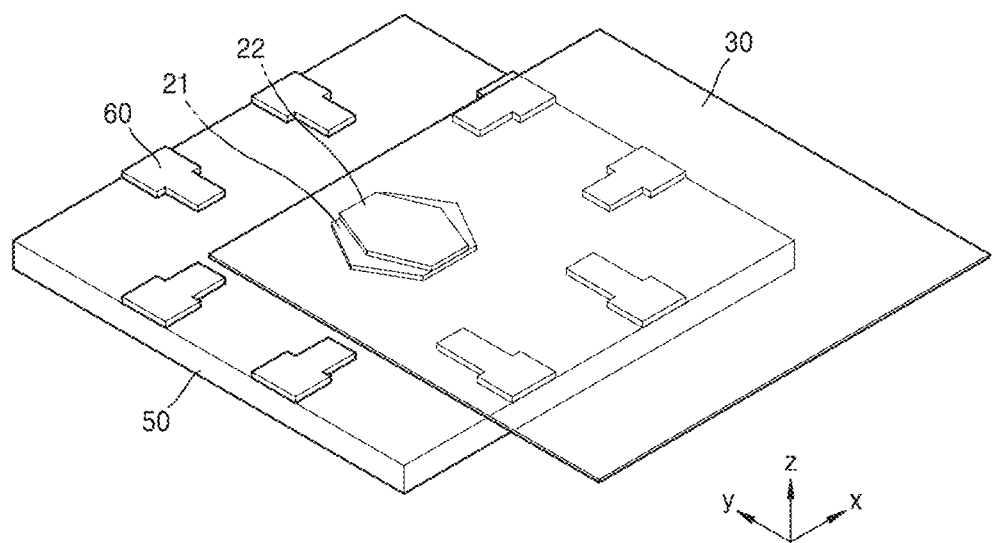

The transfer film 30, whose lower surface the second transfer target 22 is in close contact with, may be separated from the source substrate 10, and then, the transfer film 30, whose lower surface the second transfer target 22 is in close contact with, may be placed on a target substrate 50 such as a wafer or silicon oxide, as shown in FIG. 11.

FIG. 11 shows a case in which the transfer film 30 and the target substrate 50 are aligned such that the second transfer target 22 is placed on the first transfer target 21 already transferred on the target substrate 50. However, the present disclosure is not limited to this. For example, the transfer film 30 may be aligned on a separate target substrate, instead of the target substrate 50 on which the first transfer target 21 exists. Also, FIG. 11 shows a case in which the size of the transfer film 30 is equal to and similar to the size of the source substrate 10 and/or the target substrate 50. However, the present disclosure is not limited to this. For example, an area of the transfer film 30 may be sufficiently wider than that of the target substrate 50, and thus, even when a relative position of the transfer film 30 with respect to the target substrate 50 is adjusted such that the second transfer target 22 is located on the first transfer target 21, all edges of the target substrate 50 may be covered by the transfer film 30. Hereinafter, for convenience of description, a case in which the second transfer target 22 is transferred to the target substrate 50 to which the first transfer target 21 has been transferred will be described.

Figure 12:
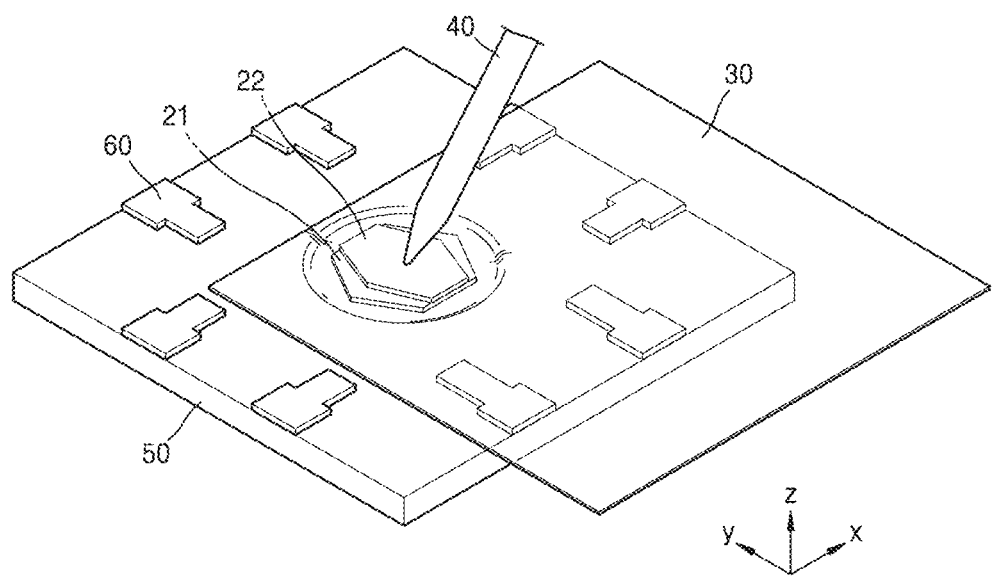
Figure 13:
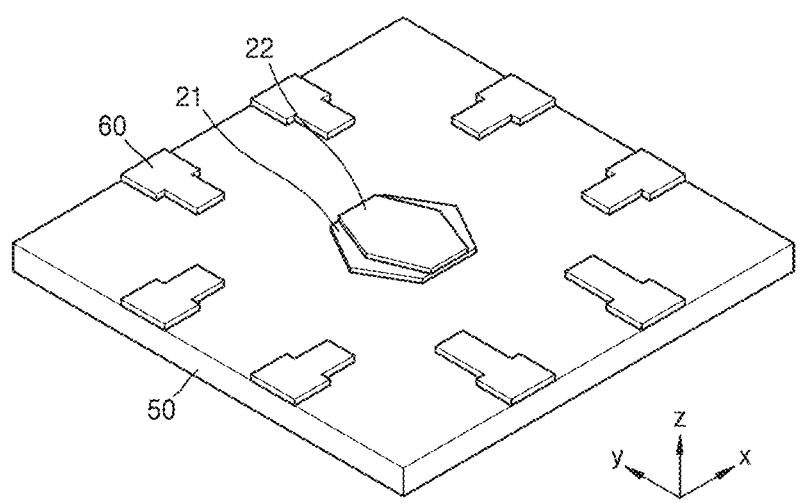

Thereafter, as shown in FIG. 12, pressure may be applied to a portion of the transfer film 30 corresponding to the second transfer target 22 to place the second transfer target 22 at a predetermined portion on the target substrate 50. Then, likewise, pressure may be applied selectively to the portion of the transfer film 30 through the probe 40. When pressure is applied to the transfer film 30, van der Waals' forces may increase between the second transfer target 22 below the transfer film 30 and the target substrate 50 or the first transfer target 21 already transferred to the target substrate 50 so that the second transfer target 22 comes into close contact with the target substrate 50. Then, when the transfer film 30 is separated from the target substrate 50, the transfer film 30 may be separated from the target substrate 50 in the state in which the second transfer target 22 is in close contact with the target substrate 50, as shown in FIG. 13. Accordingly, as shown in FIG. 13, an electronic device in which the second transfer target 22 is positioned at a predetermined location may be manufactured.

In the electronic device manufacturing method according to the current embodiment, it may be possible to exactly and selectively transfer the first transfer target 21 among various components existing on the source substrate 10 and positioned apart from each other to the target substrate 50, and then to again exactly and selectively transfer the second transfer target 22 among the remaining components on the source substrate 10 to the target substrate 50. Accordingly, it may be possible to significantly increase the productivity of electronic devices. Therefore, it may be possible to efficiently manufacture a single electronic device or a plurality of electronic devices, while reducing a total amount of a material to be used.

Meanwhile, a surrounding environment condition when the second transfer target 22 comes into close contact with the lower surface of the transfer film 30 may be different from a surrounding environment condition when the second transfer target 22 being in close contact with the lower surface of the transfer film 30 is placed on the target substrate 50. This will be able to be understood by referring to the above description about the surrounding environment condition when the first transfer target 21 comes into close contact with the lower surface of the transfer film 30 and the surrounding environment condition when the first transfer target 21 being in close contact with the lower surface of the transfer film 30 is placed on the target substrate 50, and therefore, further descriptions therefor will be omitted.

Figure 14:
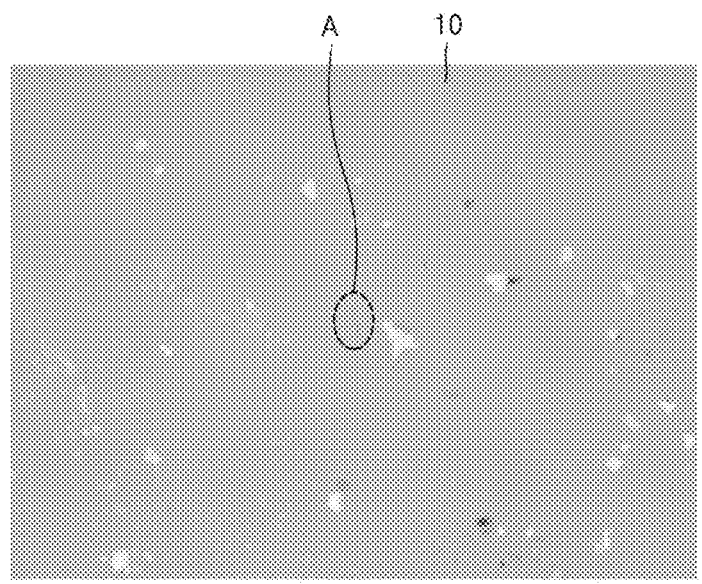
FIGS. 14 to 18 are pictures showing processes for manufacturing an electronic device using the electronic device manufacturing methods according to the embodiments.
Figure 15:
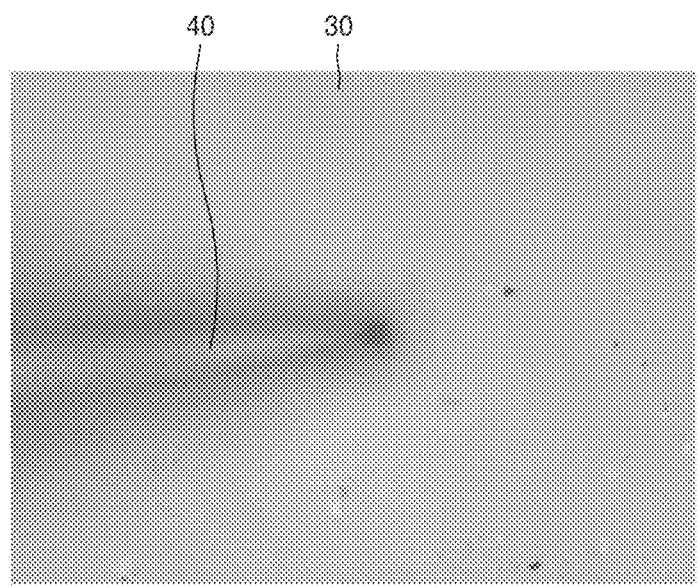
Figure 16:
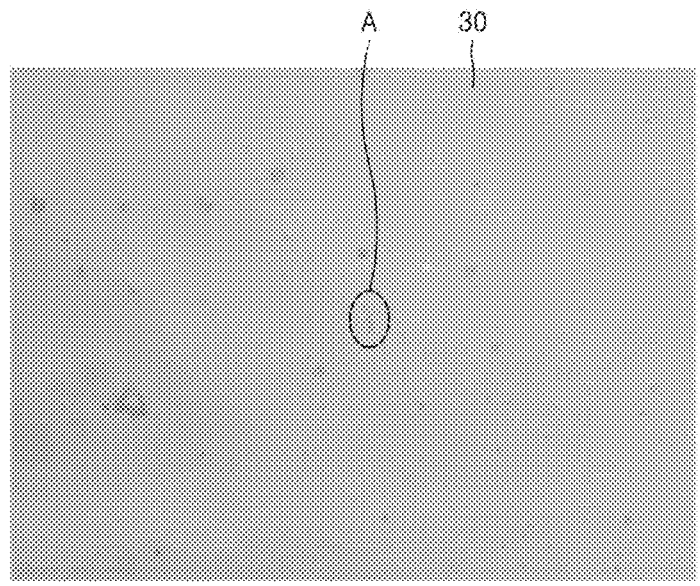

FIGS. 14 to 18 are pictures showing processes for manufacturing an electronic device using the electronic device manufacturing method according to the embodiment described above with reference to FIGS. 1 to 7. FIG. 14 is a picture showing a transfer target A among various functional layers existing on the source substrate 10. FIG. 15 is a picture showing a process of placing the transfer film 30 on the source substrate 10 and applying pressure to a portion of the transfer film 30 that corresponds to the transfer target A by using the probe 40. By applying pressure to the portion of the transfer film 30 corresponding to the transfer target A and then separating the transfer film 30 from the source substrate 10, the transfer target A may be attached on the lower surface of the transfer film 30, as seen in the picture of FIG. 16.

Figure 17:
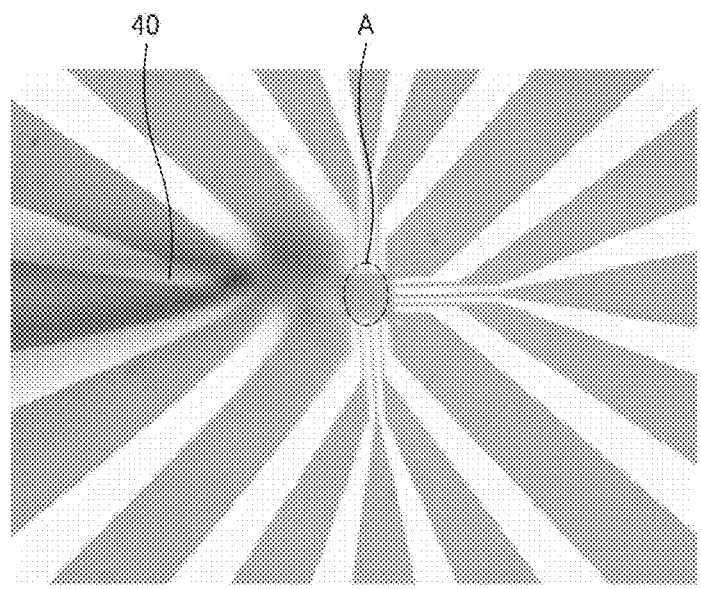
Figure 18:
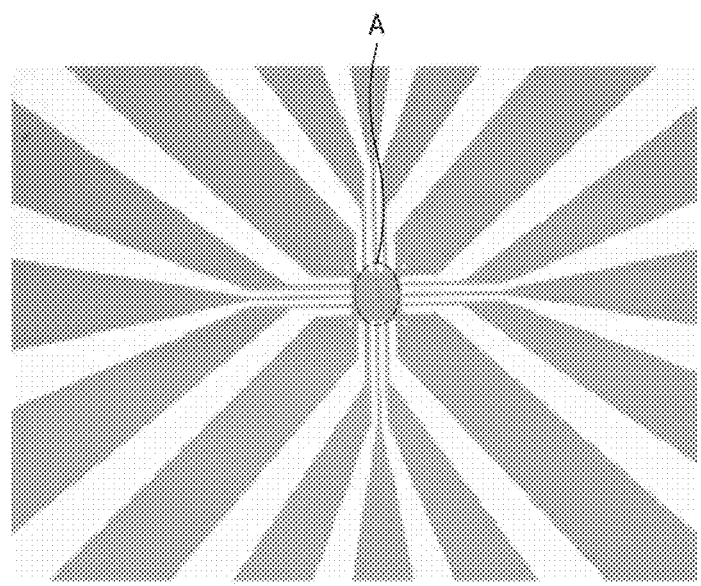
Figure 19:
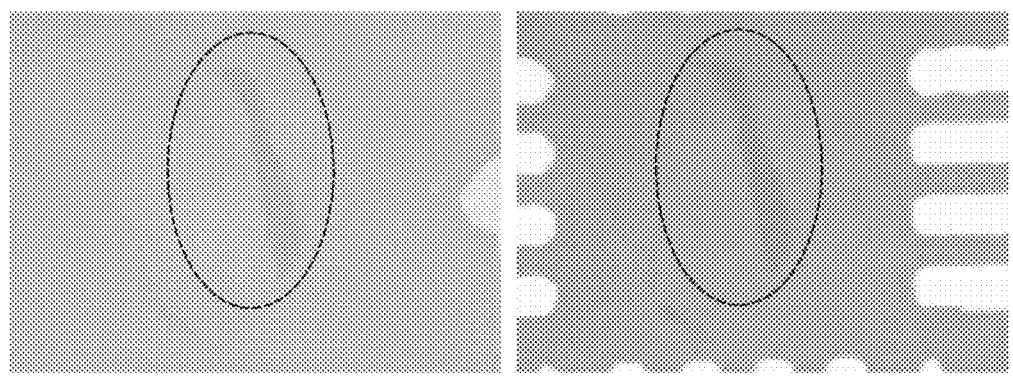
FIG. 19 is enlarged views of parts of the picture before transferring and the picture after transferring among the pictures.

Thereafter, the transfer film 30 may be aligned with respect to the target substrate 50, and then pressure may be applied to a portion of the transfer film 30 on which the transfer target A is attached through the probe 40, as seen in the picture of FIG. 17. In order to prevent the transfer target A or components on the target substrate 50 below the transfer film 30 from being damaged by the pressure applied to the transfer film 30 from the probe 40, the portion of the transfer film 30 to which pressure is applied from the probe 40 may be not an area at which the transfer film 30 overlaps the transfer target A, but an area adjacent to the area at which the transfer film 30 overlaps the transfer target A, as seen in the picture of FIG. 17. In this case, since it is possible to bring the transfer target A into close contact with the target substrate 50 by indirect pressure, the transfer target A may be placed on the target substrate 50 when the transfer film 30 is removed, as seen in the picture of FIG. 18. FIG. 19 is enlarged views of parts of the picture (picture of FIG. 14) before transferring and the picture (picture of FIG. 18) after transferring among the above-described pictures.

FIGS. 20 to 24 are pictures showing processes for manufacturing an electronic device using an electronic device manufacturing method according to still another embodiment of the present disclosure. First, the transfer film 30 may be placed on a plurality of functional layers A, B, and C positioned apart from each other on a source substrate. Then, pressure may be applied to a portion of the transfer film 30 that corresponds to a first transfer target A from among the plurality of functional layers A, B, and C through a probe to bring the first transfer target A into close contact with the lower surface of the transfer film 30. Successively, pressure may be applied to a portion of the transfer film 30 that corresponds to a second transfer target B from among the plurality of functional layers A, B, and C through the probe to bring the second transfer target B into close contact with the lower surface of the transfer film 30. Also, pressure may be applied to a portion of the transfer film 30 corresponding to a third transfer target C to bring the third transfer target C into close contact with the lower surface of the transfer film 30.

Figure 20:
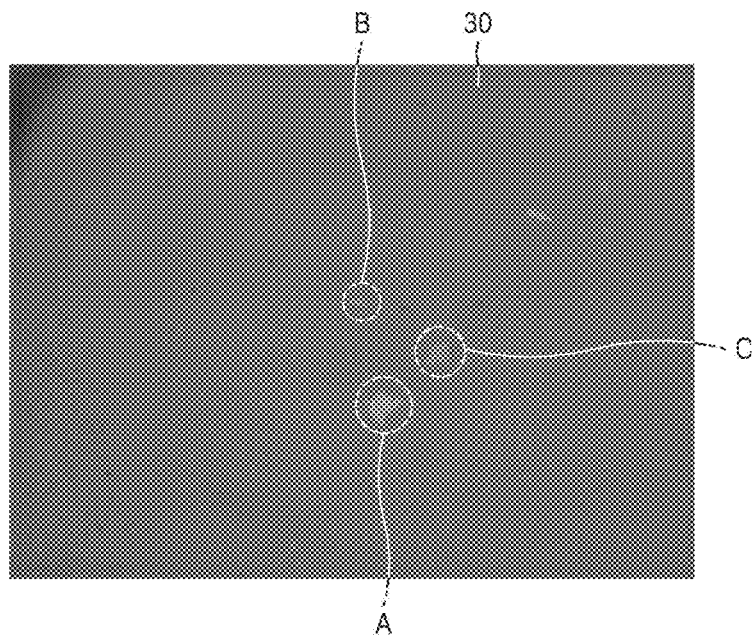
FIGS. 20 to 24 are pictures showing processes for manufacturing an electronic device using an electronic device manufacturing method according to still another embodiment of the present disclosure.

Then, the transfer film 30 may be separated from the source substrate in the state in which the first transfer target A, the second transfer target B, and the third transfer target C as necessary are in close contact with the lower surface of the transfer film 30. A picture taken after the transfer film 30 is separated from the source substrate is shown in FIG. 20.

Figure 21:
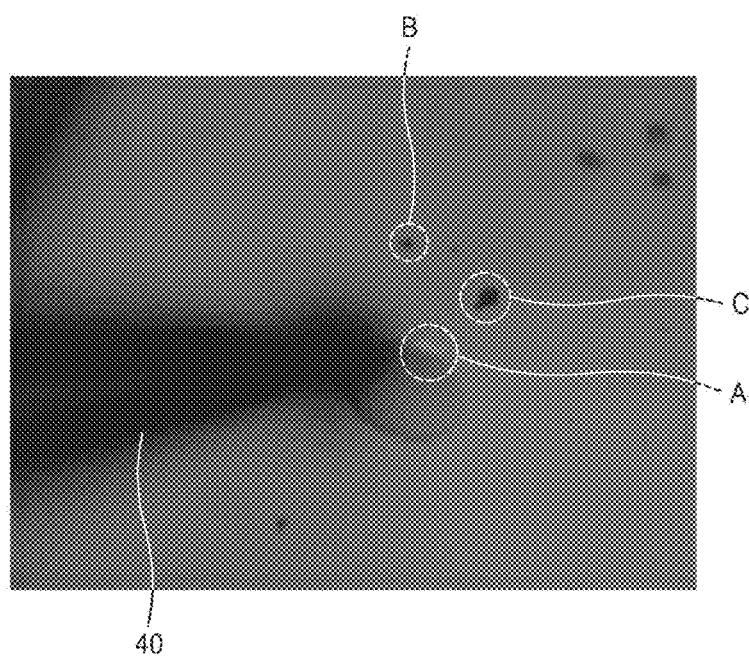

Thereafter, the transfer film 30, whose lower surface the first transfer target A, the second transfer target B, and the third transfer target C as necessary are in close contact with, may be aligned with respect to a target substrate to be placed on the target substrate. This may be understood as a process of locating the first transfer target A at a location of the target substrate to which the first transfer target A is to be transferred. Then, as seen in the picture of FIG. 21, pressure may be applied to a portion of the transfer film 30 that corresponds to the first transfer target A through the probe 40 to bring the first transfer target A into close contact with the target substrate. Thereafter, the transfer film 30 may be separated from the target substrate in the state in which the first transfer target A is positioned on the target substrate, and the second transfer target B and the third transfer target C are in close contact with the lower surface of the transfer film 30.

Figure 22:
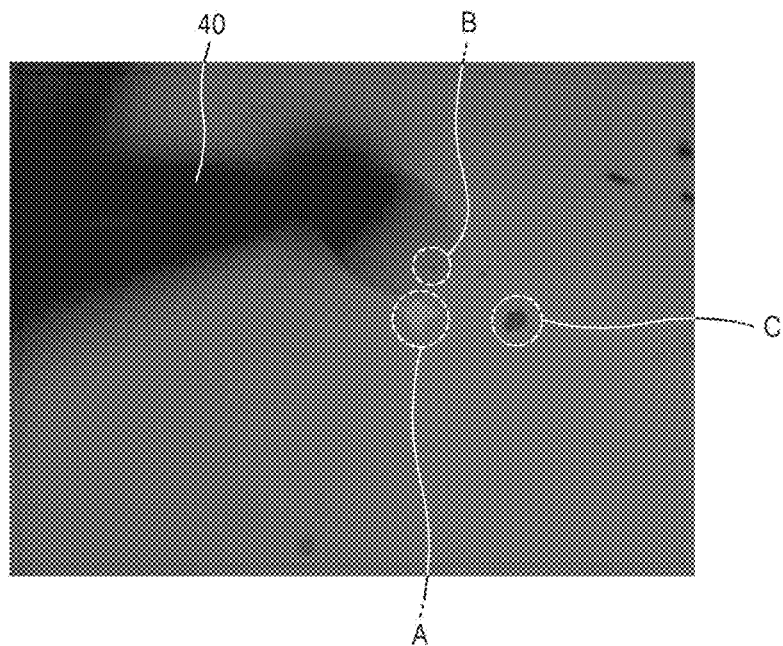

Successively, the transfer film 30 may be again aligned with respect to the target substrate in the state in which the second transfer target B and the third transfer target C are in close contact with the lower surface of the transfer film 30, to be placed on the target substrate. This may be understood as a process for placing the second transfer target B at a location of the target substrate to which the second transfer target B is to be transferred. Then, as seen in the picture of FIG. 22, pressure may be applied to a portion of the transfer film 30 that corresponds to the second transfer target B through the probe 40 to place the second transfer target B on the target substrate. Then, the second transfer target B as well as the first transfer target A may be placed on the target substrate, and the transfer film 30 may be separated from the target substrate in the state in which the third transfer target C is in close contact with the lower surface of the transfer film 30.

Figure 23:
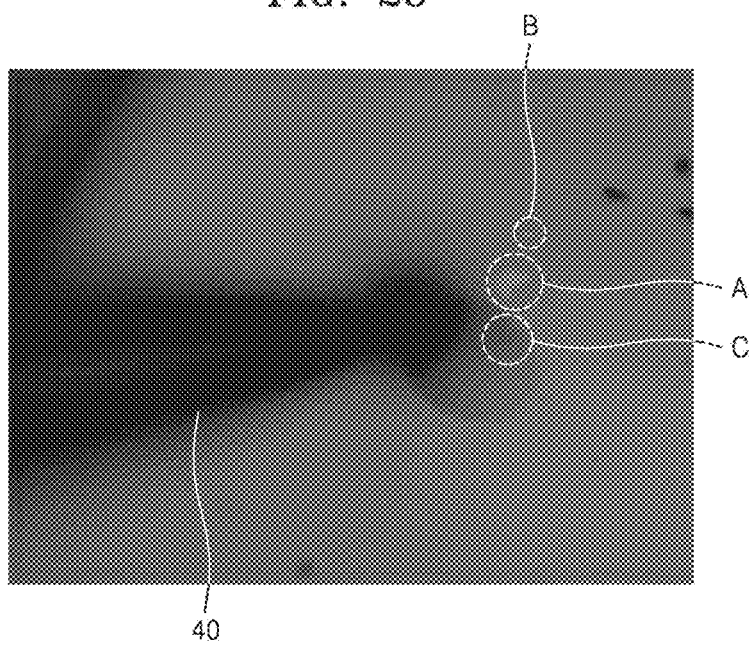

Thereafter, the transfer film 30, whose lower surface the third transfer target C is in close contact with, may be again aligned with respect to the target substrate, to be placed on the target substrate, as necessary. This may be understood as a process for placing the third transfer target C at a location of the target substrate to which the third transfer target C is to be transferred. As seen in the picture of FIG. 23, pressure may be applied to a portion of the transfer film 30 that corresponds to the third transfer target C through the probe 40 to place the third transfer target C on the target substrate. Then, the transfer film 30 may be separated from the target substrate in the state in which the first to third transfer targets A to C are positioned on the target substrate.

Figure 24:
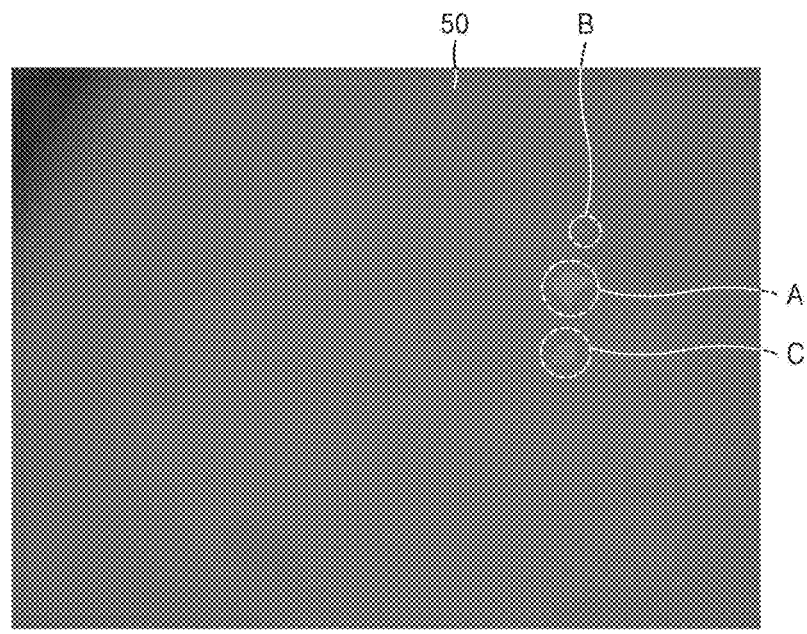

FIG. 24 shows a picture taken when the first to third transfer targets A to C are positioned on the target substrate 50 through the processes. Comparing the picture of FIG. 20 with the picture of FIG. 24, it may be confirmed that relative positions of the first to third transfer targets A to C on the source substrate 30 are different from relative positions of the first to third transfer targets A to C on the target substrate 50.

In a typical electronic device manufacturing method, when functional layers on a source substrate are transferred to a target substrate, the functional layers should be transferred simultaneously to the target substrate. Therefore, there is a problem that the functional layers on the source substrate are transferred as they are to the target substrate so that the relative positions of the functional layers on the target substrate are identical to those of the functional layers on the source substrate. However, in the electronic device manufacturing method according to the current embodiment, the functional layers on the source substrate may be transferred to the target substrate such that the relative positions of the functional layers on the target substrate are different from those of the functional layers on the source substrate, and accordingly, it may be possible to significantly increase the productivity and degree of freedom of manufacturing process of electronic devices.

The environmental condition when the functional layers are transferred from the source substrate to the transfer film and the environmental condition when the functional layers are transferred from the transfer film to the target substrate in the processes described above with reference to FIGS. 20 to 24 may adopt the same environmental conditions used in the electronic device manufacturing method according to the embodiment described above with reference to FIGS. 1 to 7, and accordingly, detailed descriptions thereof will be omitted.

Figure 25:
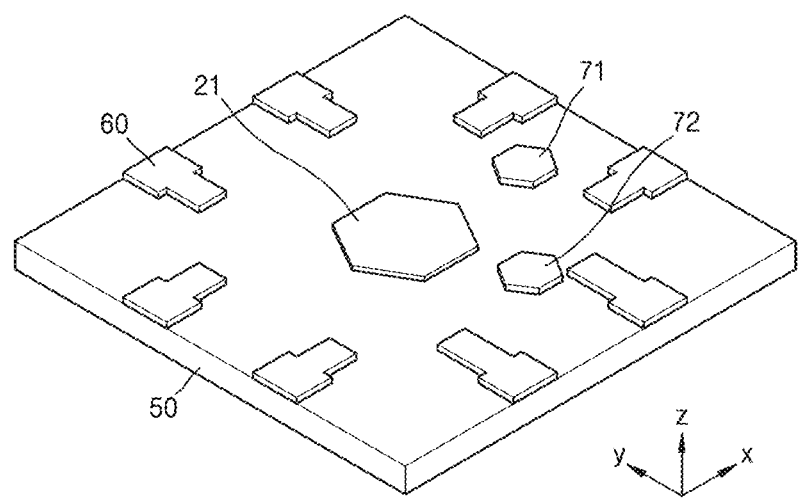
FIG. 25 is a perspective view schematically showing a process of an impurity removing method according to still another embodiment (an embodiment?) of the present disclosure.

Meanwhile, the present disclosure is not limited to the electronic device manufacturing method, and a method for removing impurities may also belong to the scope of the present disclosure. For example, when the functional layer 21, etc. are formed directly on the substrate 50 or transferred to the substrate 50 in the process for manufacturing an electronic device as shown in FIG. 25, a first impurity 71 may exist on the substrate 50. In order to selectively remove the first impurity 71 without damaging the functional layer 21, etc. on the substrate 50, a transfer film may be placed on the first impurity 71, and pressure may be applied to a portion of the transfer film that corresponds to the first impurity 71 through a probe to bring the first impurity 71 into close contact with the lower surface of the transfer film. Successively, the transfer film may be separated from the substrate 50 in the state in which the first impurity 71 is in close contact with the lower surface of the transfer film, thereby selectively and effectively removing the first impurity 71. However, the method for removing impurities may be a part of the electronic device manufacturing method.

Also, when a second impurity 72 exists on the substrate 50 in addition to the first impurity 71, as shown in FIG. 25, the transfer film may be again placed on the second impurity 72 on the substrate 50 after the first impurity 71 is removed, and likewise, pressure may be applied to a portion of the transfer film that corresponds to the second impurity 72 through the probe to bring the second impurity 72 into close contact with the lower surface of the transfer film, and then the transfer film, whose lower surface the second impurity 72 is in close contact with, may be separated from the substrate, thereby selectively removing the second impurity 72.

When the second impurity 72 is removed, the second impurity 72 may be removed in the state in which the first impurity 71 is in close contact with the lower surface of the transfer film, or the second impurity 71 may be removed after the first impurity 71 is removed from the lower surface of the transfer film. In the latter case, the transfer film, whose lower surface the first impurity 71 is in close contact with, may be placed on a removal substrate, pressure may be applied to a portion of the transfer film corresponding to the first impurity 71 to bring the first impurity 71 into close contact with the removal substrate, and then the transfer film may be separated from the removal substrate in the state in which the first impurity 71 is positioned on the removal substrate, thereby removing the first impurity 71 from the lower surface of the transfer film.

Descriptions about the electronic device manufacturing method according to the embodiment described above with reference to FIGS. 1 to 7 may be applied to the process for removing impurities. That is, the transfer film used in the process for removing impurities may include polydimethylsiloxane (PDMS), CYTOP, polymethylmethacrylate (PMMA), ethyl lactate, polycarbonate (PC), poly propylene carbonate (PPC), polyimide (PI), para-aramid fibrid, polyethylene terephthalate (PET), polyvinyl chloride (PVC), polyvinyl acetate (PVAc), silica-gel, or polyurethane acrylate (PUA). A first temperature of a surrounding environment during operation of bringing the first impurity 71 and/or the second impurity 72 into close contact with the lower surface of the transfer film may be different from a second temperature of a surrounding environment during operation of bringing the first impurity 71 and/or the second impurity 72 into close contact with the removal substrate. More specifically, the first temperature may be higher than the second temperature. For example, the first temperature may be between 50° C. to 130° C. and the second temperature may be between 10° C. and 30° C.

Through the method, various electronic devices including a thin-film transistor of a single-layer structure or a multi-layer structure may be manufactured.

While the present disclosure has been described with reference to exemplary embodiments shown in the drawings, it will be understood by one of ordinary skill in the art that various modifications and equivalent embodiments may be made from the embodiments. Thus, the scope of the present disclosure should be defined by the appended claims.

INDUSTRIAL APPLICABILITY

A method for manufacturing an electronic device capable of efficiently utilizing a material, and a method for removing impurities using the same may be implemented.

What is claimed is:

1. A method for manufacturing an electronic device, comprising:
    placing a transfer film on a plurality of functional layers positioned apart from each other on a source substrate;
    applying pressure to a portion of the transfer film that corresponds to a first transfer target from among the plurality of functional layers through a probe to bring the first transfer target into close contact with a lower surface of the transfer film;
    separating the transfer film from the source substrate in a state in which the first transfer target is in close contact with the lower surface of the transfer film;
    placing the transfer film on a target substrate in the state in which the first transfer target is in close contact with the lower surface of the transfer film;
    applying pressure to a portion of the transfer film corresponding to the first transfer target to place the first transfer target on the target substrate; and
    separating the transfer film from the target substrate in a state in which the first transfer target is placed on the target substrate.

2. The method of claim 1, wherein the plurality of functional layers include:
    a one-dimensional micro material layer or a one-dimensional nano material layer, having a shape of tubes, wires, or bars; or
    a two-dimensional micro material layer or a two-dimensional nano material layer, including graphene, transition metal dichalocogenide, hexagonal boron nitride, or phosphorus black.

3. The method of claim 1, wherein the transfer film comprises polydimethylsiloxane (PDMS), CYTOP, polymethylmethacrylate (PMMA), ethyl lactate, polycarbonate (PC), poly propylene carbonate (PPC), polyimide (PI), para-aramid fibrid, polyethylene terephthalate (PET), polyvinyl chloride (PVC), polyvinyl acetate (PVAc), silica-gel, or polyurethane acrylate (PUA).

4. The method of claim 1, wherein a first temperature of a surrounding environment during operation of bringing the first transfer target into close contact with the lower surface of the transfer film is different from a second temperature of a surrounding environment during operation of placing the first transfer target on the target substrate.

5. The method of claim 4, wherein the first temperature is higher than the second temperature.

6. The method of claim 4, wherein the first temperature is between 50° C. and 130° C., and the second temperature is between 10° C. and 30° C.

7. The method of claim 1, further comprising:
    again placing the transfer film on the remaining functional layers on the source substrate;
    applying pressure to a portion of the transfer film that corresponds to a second transfer target from among the remaining functional layers through the probe to bring the second transfer target into close contact with the lower surface of the transfer film;
    separating the transfer film from the source substrate in a state in which the second transfer target is in close contact with the lower surface of the transfer film;
    placing the transfer film on the target substrate in the state in which the second transfer target is in close contact with the lower surface of the transfer film;
    applying pressure on a portion of the transfer film that corresponds to the second transfer target to place the second transfer target on the target substrate; and
    separating the transfer film from the target substrate in a state in which the second transfer target is placed on the target substrate.

8. A method for manufacturing an electronic device, comprising:
    placing a transfer film on a plurality of functional layers positioned apart from each other on a source substrate;
    applying pressure to a portion of the transfer film that corresponds to a first transfer object from among the plurality of functional layers through a probe to bring the first transfer target into close contact with a lower surface of the transfer film;
    applying pressure to a portion of the transfer film that corresponds to a second transfer object from among the plurality of functional layers through the probe to bring the second transfer target into close contact with the lower surface of the transfer film;
    separating the transfer film from the source substrate in a state in which the first transfer target and the second transfer target are in close contact with the lower surface of the transfer film;
    aligning the transfer film with respect to a target substrate in the state in which the first transfer target and the second transfer target are in close contact with the lower surface of the transfer film to place the transfer film on the target substrate;
    applying pressure to a portion of the transfer film corresponding to the first transfer target to place the first transfer target on the target substrate;
    separating the transfer film from the target substrate in a state in which the first transfer target is placed on the target substrate and the second transfer target is in close contact with the lower surface of the transfer film;
    aligning the transfer film with respect to the target substrate in the state in which the second transfer target is in close contact with the lower surface of the transfer film to place the transfer film on the target substrate; and
    applying pressure to a portion of the transfer film that corresponds to the second transfer target to place the second transfer target on the target substrate; and
    separating the transfer film from the target substrate in a state in which the first transfer target and the second transfer target are placed on the target substrate.

9. The method of claim 8, wherein the plurality of functional layers include:
    a one-dimensional micro material layer or a one-dimensional nano material layer, having a shape of tubes, wires, or bars; or
    a two-dimensional micro material layer or a two-dimensional nano material layer, including graphene, transition metal dichalocogenide, hexagonal boron nitride, or phosphorus black.

10. The method of claim 8, wherein the transfer film comprises polydimethylsiloxane (PDMS), CYTOP, polymethylmethacrylate (PMMA), ethyl lactate, polycarbonate (PC), poly propylene carbonate (PPC), polyimide (PI), para-aramid fibrid, polyethylene terephthalate (PET), polyvinyl chloride (PVC), polyvinyl acetate (PVAc), silica-gel, or polyurethane acrylate (PUA).

11. The method of claim 8, wherein a first temperature of a surrounding environment during operation of bringing the first transfer target into close contact with the lower surface of the transfer film is different from a second temperature of a surrounding environment during operation of placing the first transfer target on the target substrate.

12. The method of claim 11, wherein the first temperature is higher than the second temperature.

13. The method of claim 11, wherein the first temperature is between 50° C. and 130° C., and the second temperature is between 10° C. and 30° C.

14. A method for removing an impurity, comprising:
forming a functional layer on a substrate;
placing a transfer film on a first impurity on the substrate;
applying pressure to a portion of the transfer film that corresponds to the first impurity through a probe to bring the first impurity into close contact with a lower surface of the transfer film;
separating the transfer film from the substrate in a state in which the first impurity is in close contact with the lower surface of the transfer film;
placing the transfer film on a removal substrate in the state in which the first impurity is in close contact with the lower surface of the transfer film;
applying pressure to a portion of the transfer film that corresponds to the first impurity to place the first impurity on the removal substrate; and
separating the transfer film from the removal substrate in a state in which the first impurity is placed on the removal substrate.

15. The method of claim 14, wherein the transfer film comprises polydimethylsiloxane (PDMS), CYTOP, polymethylmethacrylate (PMMA), ethyl lactate, polycarbonate (PC), poly propylene carbonate (PPC), polyimide (PI), para-aramid fibrid, polyethylene terephthalate (PET), polyvinyl chloride (PVC), polyvinyl acetate (PVAc), silica-gel, or polyurethane acrylate (PUA).

16. The method of claim 14, wherein a first temperature of a surrounding environment during operation of bringing the first impurity into close contact with the lower surface of the transfer film is different from a second temperature of a surrounding environment during operation of placing the first impurity target on the removal substrate.

17. The method of claim 16, wherein the first temperature is higher than the second temperature.

18. The method of claim 16, wherein the first temperature is between 50° C. and 130° C., and the second temperature is between 10° C. and 30° C.

19. A method for removing an impurity, comprising:
forming a functional layer on a substrate;
placing a transfer film on a first impurity on the substrate;
applying pressure to a portion of the transfer film that corresponds to the first impurity through a probe to bring the first impurity into close contact with a lower surface of the transfer film;
separating the transfer film from the substrate in a state in which the first impurity is in close contact with the lower surface of the transfer film;
again placing the transfer film on a second impurity on the substrate;
applying pressure to a portion of the transfer film that corresponds to the second impurity through a probe to bring the second impurity into close contact with the lower surface of the transfer film; and
separating the transfer film from the substrate in a state in which the second impurity is in close contact with the lower surface of the transfer film.

* * * * *